(12) United States Patent
Daubenspeck et al.

(10) Patent No.: US 8,513,814 B2
(45) Date of Patent: Aug. 20, 2013

(54) BUFFER PAD IN SOLDER BUMP CONNECTIONS AND METHODS OF MANUFACTURE

(75) Inventors: Timothy H. Daubenspeck, Coldchester, VT (US); Jeffrey P. Gambino, Westford, VT (US); Christopher D. Muzzy, Burlington, VT (US); Wolfgang Sauter, Hinesburg, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/098,816

(22) Filed: May 2, 2011

(65) Prior Publication Data

US 2012/0280399 A1  Nov. 8, 2012

(51) Int. Cl.
*H01L 23/48* (2006.01)

(52) U.S. Cl.
USPC ........... 257/774; 257/738; 257/781; 257/208; 257/E21.506; 257/E23.011; 438/614; 438/123

(58) Field of Classification Search
USPC ................. 257/738, 786, 737, 204, 673, 691; 438/614, 123, 613
See application file for complete search history.

(56) References Cited

U.S. PATENT DOCUMENTS

| | | | |
|---|---|---|---|
| 3,711,625 A | 1/1973 | Dupuis | |
| 6,539,624 B1 | 4/2003 | Kung et al. | |
| 6,709,964 B2 | 3/2004 | Lee | |
| 6,787,924 B2 | 9/2004 | Tsunemasu | |
| 7,005,752 B2 * | 2/2006 | Bojkov et al. | 257/786 |
| 7,294,929 B2 | 11/2007 | Miyazaki | |
| 7,355,279 B2 * | 4/2008 | Ke et al. | 257/737 |
| 7,423,348 B2 * | 9/2008 | Lu | 257/783 |
| 7,439,170 B1 | 10/2008 | Daubenspeck et al. | |
| 7,446,405 B2 | 11/2008 | Kim et al. | |
| 7,468,545 B2 | 12/2008 | Lin et al. | |
| 7,667,336 B2 * | 2/2010 | Ishio | 257/781 |
| 7,842,598 B2 | 11/2010 | Hashimoto | |
| 2005/0048772 A1 | 3/2005 | Pan | |
| 2006/0205200 A1 | 9/2006 | Richiuso | |
| 2008/0035959 A1 * | 2/2008 | Jiang | 257/204 |
| 2009/0189286 A1 | 7/2009 | Daubenspeck et al. | |
| 2010/0032835 A1 * | 2/2010 | Daubenspeck et al. | 257/738 |
| 2011/0006422 A1 | 1/2011 | Daubenspeck et al. | |

FOREIGN PATENT DOCUMENTS

JP  2078259  3/1990

* cited by examiner

*Primary Examiner* — William F Kraig
*Assistant Examiner* — Sheng Zhu
(74) *Attorney, Agent, or Firm* — David Cain; Roberts Mlotkowski Safran & Cole, P.C.

(57) ABSTRACT

Structures are provided with raised buffer pads for solder bumps. Methods are also provided for forming the raised buffer pads for solder bumps. The method includes forming a raised localized buffer pad structure on a tensile side of a last metal layer of a solder bump connection. The raised localized buffer pad structure increases a height of a portion of a pad structure of the solder bump connection with respect to a compressive side of the last metal layer.

11 Claims, 6 Drawing Sheets

BUFFER PAD IN SOLDER BUMP CONNECTIONS AND METHODS OF MANUFACTURE

FIELD OF THE INVENTION

The invention relates to semiconductor structures and methods of manufacture and, more particularly, to structures with localized buffer pads for solder bumps (e.g., lead free solder bumps) and methods of manufacture.

BACKGROUND

Solder bumps are commonly used as an electrical connection between semiconductor chips and ceramic or organic substrates used to connect to the outside world. There are a variety of processes that can be used to connect the solder bump to the chip. In one such method, the finished chip is coated with one or more layers of protective insulator that protects the last level of metallization from mechanical handling damage and corrosion or oxidation. In order to connect the solder to the last metallization layer, a hole or "via" is formed in the protective insulation, and another conductive layer (under bump metallurgy) is deposited both into the via and over a region surrounding the via. The shape of the via is usually circular, and is centered with respect to the position of the solder bump. The last conductive layer has a dual purpose: (i) adhesion to the protective insulating layer, and (ii) formation of a good metallurgical bond with the solder.

Once the solder bumps are deposited onto the chip, the chip is then joined to the substrate by positioning the chip so that the solder bumps are aligned with the appropriate pads on the substrate, then heated in a furnace to above the melting point of the solder. However, the substrate has a much larger thermal expansion coefficient than the chip, which results in the substrate shrinking much more than the chip during cooling processes. This, in turn, causes shear stresses to develop on the solidified solder bumps, basically due to the thermal expansion mismatch between materials of the substrate and solder bump. This is even more exaggerated in technologies from 90 nm node and forward as such technologies employ advanced low-K and ultra-low-K back of the end line (BEOL) dielectrics, which are susceptible to delamination or cracking in response to the chip join thermal expansion coefficient stresses.

The shear stresses exert a rotating moment on the solder bumps that is perpendicular to the radial direction from the chip geographic center and the solder bump. The moment causes tensile stress to be concentrated at the outer edge of the solder bump where it comes into contact with the chip, and this tensile stress acts to pull the solder away from the surface of the chip. Accordingly, the relative displacement between the surface of the substrate and that of the chip is greater farther from the geographical center of the chip, such that the outermost solder bumps experience the largest shear stresses.

One way to alleviate the magnitude of the tensile stress at the edge of the via is to move the via edge farther away from the perimeter of the solder bump, either by decreasing the diameter of the via or increasing the diameter of the solder bump. However, increasing the diameter of the solder bump places restrictions on the bump placement, which directly competes with the drive to shrink the chip footprint. Decreasing the diameter of the via, on the other hand, begins to affect the current carrying ability of the joint, leading to earlier failure by solder bump electromigration. Thus, there are constraints on both the diameter of the via and that of the solder bump.

Accordingly, there exists a need in the art to overcome the deficiencies and limitations described hereinabove.

SUMMARY

In a first aspect of the invention, a method comprises forming a raised localized buffer pad structure on a tensile side of a last metal layer of a solder bump connection. The raised localized buffer pad structure increases a height of a portion of a pad structure of the solder bump connection with respect to a compressive side of the last metal layer.

In another aspect of the invention, a method of forming an integrated circuit comprises forming a plurality of final vias comprising a ball metallurgy layer in electrical connection with an underlying wiring layer. The method further comprises forming a raised, localized buffer pad aligned with a tensile side of the metal layer in each of the plurality of final vias. The method further comprises forming a ball metallurgy layer on the metal layer of each of the plurality of final vias, with an edge thereof raised, compared to a compressive side of the metal layer, and approximately aligned with a center of the raised, localized buffer pad. The method further comprises forming a solder bump on the ball metallurgy layer, with an edge thereof substantially aligned with the edge of the ball metallurgy layer.

In yet another aspect of the invention, a structure comprises at least one via formed in contact with an underlying metal pad of a chip. The structure further comprises a localized buffer pad structure formed on a tensile side of the at least one via, which has a height different than a compressive side of the at least one via.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the solder bump connection of the present invention, which comprises the structures of the present invention. In still further embodiments, a method in a computer-aided design system is provided for generating a functional design model of the solder bump connection of the present invention. The method comprises generating a functional representation of the structural elements of the solder bump connection of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to structures with localized (discrete) buffer pads for solder bumps and methods of manufacture. More specifically, the present invention is directed to solder vias that include discrete, localized raised buffer pads, which are configured and/or structured to alleviate the magnitude of the tensile stresses imposed on the chip. In embodiments, the solder bump employs a discrete buffer pad of insulator material such as, for example, a thick photosensitive polyimide (PSPI), covering only a tensile side of a last metal layer, e.g., aluminum or copper pad, which underlies the ball limiting metallurgy (BLM). In further embodiments, the buffer pad of thick insulator material (e.g., PSPI material) can be formed over an existing standard layer of PSPI into which the via is already fabricated, or it can exist as a single PSPI layer of pad "islands" directly on top of the final passivation oxide/nitride films, for example. In embodiments, the buffer pad can be, e.g., about 5 µm to 30 µm or more, and can be half annular in shape or full annular in shape.

In embodiments, the buffer pad is formed as discrete islands at each solder bump, as opposed to being formed in a continuous film that may cause warpage of the wafer. In this way, advantageously, the discrete islands reduce the warpage stress imposed on the wafer, and results in an acceptable level of wafer bowing, for further manufacturing. Also, the buffer pad can be specifically rotated at each solder bump such that the tensile side of the solder bump always directly overlies the thickest portion of the buffer pad. That is, the buffer pad can be placed uniquely at each solder bump site so that it is as far from the chip center as possible. Thus, advantageously, by using the different configurations of the present invention, the tensile stresses at the outboard edge of the solder via is minimized or decreased.

Figure 1:
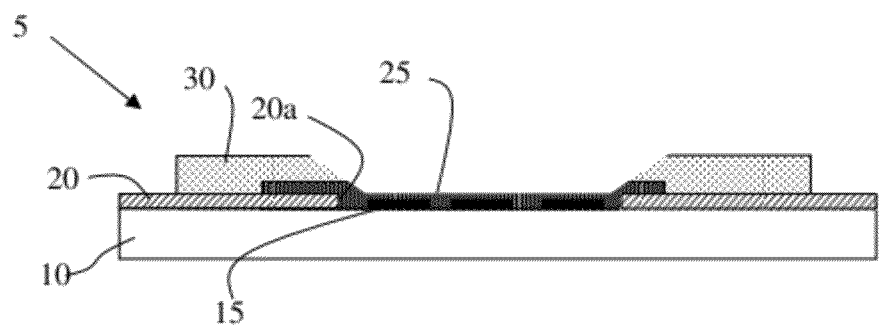
FIGS. 1-3 show fabrication processes and respective structures in accordance with aspects of the present invention.

FIG. 1 shows a structure and respective processing steps in accordance with aspects of the present invention. More specifically, the structure 5 includes a patterned wiring layer 15 on layer 10, formed using conventional deposition and lithographic processes. In embodiments, the layer 10 is representative of any back end of the line (BEOL) structure or front end of the line (FEOL) structure. For example, the layer 10 can be a dielectric layer or silicon layer deposited on top of a lower level using conventional processes such as, for example, chemical vapor deposition (CVD) processes, e.g., plasma enhanced CVD (PECVD), etc. In embodiments, for example, the layer 10 can be an oxide based material used for BEOL processes.

The wiring layer 15 is formed by blanket depositing or sputtering a metal layer on the layer 10. In embodiments, the metal layer can be, for example, any conductive material such as a copper wiring layer used in the BEOL structure. The metal layer can also be other conductive materials such as, for example, aluminum. The conductive material undergoes a patterning process using conventional lithography processes, to form the wiring layer 15. For example, a photoresist is deposited on the layer of conductive material and exposed to light to form openings (patterns). An etching process, e.g., reactive ion etching, is then performed to form the patterned wiring layer 15. In embodiments, the photoresist can be removed using any conventional ashing process.

Still referring to FIG. 1, a hard layer 20 is blanket deposited on the wiring layer 15 and exposed portions of the layer 10. In embodiments, the hard layer 20 can be, for example, a nitride film, oxide film or other passivation layer. In embodiments, the hard layer 20 can also be a combination of materials such as a nitride layer and an oxide layer, amongst other materials, and can be deposited using any conventional deposition process, e.g., CVD. The hard layer 20 undergoes a conventional lithographic patterning process to form an opening 20a, aligned with the wiring layer 15. The opening 20a can be about 10 to 100 microns in diameter; although, other dimensions are also contemplated by the present invention.

FIG. 1 further shows a pad structure 25 deposited within the opening 20a and on portions of the hard layer 20. In embodiments, the pad structure 25 can be a conventional aluminum pad structure used for solder bump connections. In embodiments, the pad structure 25 is blanket deposited using conventional deposition processes such as, for example, a PECVD, which then undergoes a patterning process using conventional lithographic techniques. For example, a photoresist is deposited on the pad material, then exposed to light to form openings (pattern), and the blanket deposited pad material, e.g., aluminum, is then patterned using a RIE process. The photoresist can be removed using an ashing process.

Still referring to FIG. 1, a passivation layer 30 (e.g., continuous film) is formed on the pad structure 25 and hard layer 20, and then patterned to form the structure 5 of FIG. 1. In embodiments, the passivation layer 30 is a photosensitive polyimide (PSPI) formed on the underlying layers by, for example, a spin on process known to those of skill in the art. In embodiments, the present invention also contemplates the use of other materials for the passivation layer 30 such as, for example, $SiO_2$, $Si_3N_4$, other polyimides (PBO) or "C" based materials such as BCB. The passivation layer 30 can be deposited to a thickness of about 4 µm or 5 µm, which will act as a buffer layer for reducing stress translated into the BEOL. The passivation layer 30 undergoes a conventional lithographic process to form opening 30a, which exposes the underlying pad structure 25 and which is aligned with the wiring layer 15.

In embodiments, the passivation layer 30 can be on the order of about 5 µm; however, the blanket formation of a passivation layer of greater than about 5 µm or 6 µm is not feasible due to film formulation issues, wafer warpage concerns and other issues. For example, a blanket passivation layer that exceeds about 5 µm in final cure thickness can contribute to warpage of a 300 mm wafer. Due to the warpage, the wafer cannot be processed through the solder bump tooling.

Figure 2:
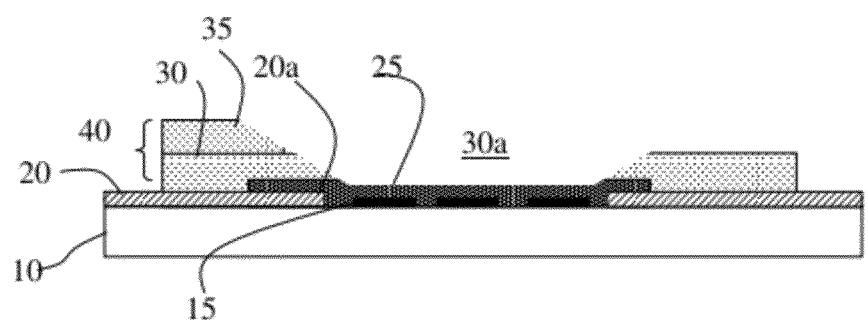

FIG. 2 shows additional processing steps and a respective structure in accordance with aspects of the present invention. More specifically, a buffer pad material 35 is deposited on the passivation layer 30 and the exposed pad structure 25. The buffer pad material 35 can be the same material as the passivation material 30, e.g., insulator material, and can be deposited, e.g., spin on, to a thickness of about 4 µm to 8 µm, and more preferably 9 µm to 12 µm. In alternative embodiments, other thicknesses are contemplated by the present invention such as, example, a total thickness of upwards of 5 µm to 30 µm (for either the combination of insulator layers or the buffer pad material 35, alone). In embodiments, the formation of the passivation material 35 will not warp the wafer, due to its formation as a localized structure.

In embodiments, the buffer pad material 35 undergoes a patterning process using conventional lithography processes. For example, a photoresist is formed on the buffer pad material 35, and openings are formed therein to expose portions of the buffer pad material 35, while protecting (e.g., acting as a mask) the buffer pad material 35 on a tensile side of the structure, e.g., directly beneath a ball limiting metallurgy (BLM) edge, i.e., the point of maximum tensile stress during chip attach processes. The buffer pad material 35 may undergo a simple photolithographic/wet develop or RIE process, removing exposed portions of the buffer pad material 35 while leaving the protected buffer pad material 35 on the tensile side of the structure. This will result in an increased thickness of a buffer pad island 40 (e.g., the buffer pad material 35 and passivation layer 30), beneath a solder bump, itself. This buffer pad island 40 will shift the final via away from the tensile side of the structure, thereby acting as a stress buffering film directly beneath a ball limiting metallurgy (BLM) edge, i.e., the point of maximum tensile stress during chip attach processes.

Figure 3:
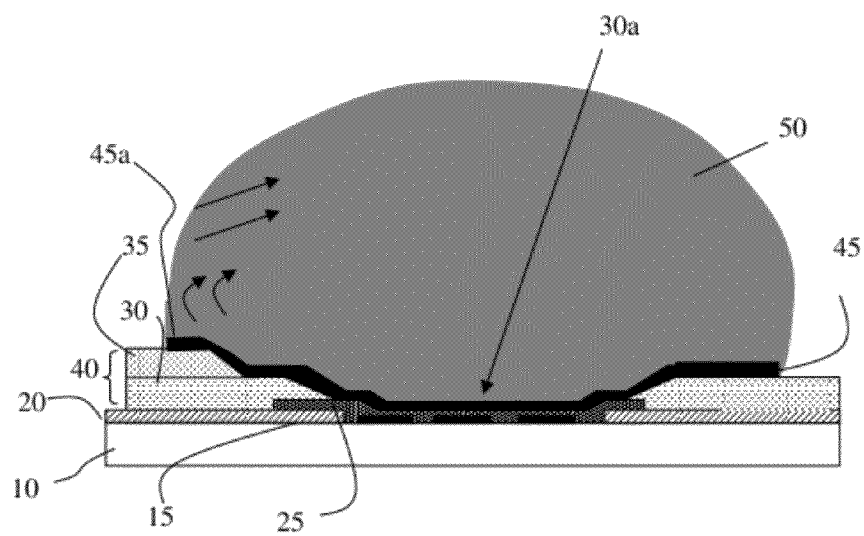

FIG. 3 shows additional processing steps and a respective structure in accordance with aspects of the present invention. More specifically, a BLM layer 45 is deposited on the pad structure 25 (through a final via 30a), as well as the passivation layer 30 and buffer pad material 35. In embodiments, the BLM layer 45 is patterned so that an edge 45a of the BLM layer 45 is approximately centered on the buffer pad material 35. In embodiments, the BLM layer 45 can be, for example, several layers such as, for example, a first layer of conductive material (e.g., Ti or TiW), with a copper layer and capping layer such as, for example, Palladium, in electrical communication with the underlying metal wiring 15 (through the pad structure 25). In embodiments, other refractory metals are also contemplated by the present invention for use as the BLM 45. A solder bump 50, e.g., preferably a lead free solder bump, is formed on the BLM layer 45, preferably with its edge aligned with the edge 45a of the BLM layer 45.

As thus shown in FIG. 3, the tensile side of the solder bump (as shown by the arrows) is at a higher level than the compressive side (opposing side) of the solder bump. In this way, the buffer pad island 40, and more specifically, the buffer pad material 35, provides stress buffering properties of soft organic polyimide-like materials. In embodiments, a secondary benefit is due to the slight extension of the bump edge from the base of the final via structure. This secondary benefit derives from the length extension or from interruption of the stress field by the more complex double-via edge created with the bump pad. In this way, it is possible to obtain a shifted via effect, e.g., provides separation of the via edge stress field from the BLM edge, while eliminating any manufacturability issues with a thicker passivation layer 30. Accordingly, the buffer pad island 40 and more specifically the buffer pad material 35 provides a tensile-only buffer pad island, which avoids warpage issue of the wafer while also decreasing stresses imposed on the structure during reflow processes of the solder bump.

Figure 4:
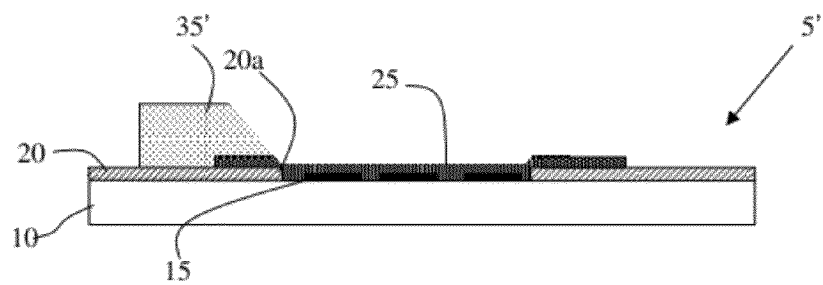
FIGS. 4-6 show fabrication processes and respective structures in accordance with additional aspects of the present invention.

FIG. 4 shows a structure and respective processing steps in accordance with additional aspects of the present invention. More specifically, the structure 5' includes a patterned wiring layer 15 on layer 10, formed using conventional deposition and lithographic processes. In embodiments, the layer 10 is representative of any BEOL structure or FEOL structure. For example, the layer 10 can be a dielectric layer or silicon layer deposited on top of a lower level using conventional processes such as, for example, CVD processes, e.g., PECVD, etc. In embodiments, for example, the layer 10 can be an oxide based material used for BEOL processes. The wiring layer 15 is formed by blanket depositing or sputtering, and patterning of a metal layer on the layer 10, as described with reference to FIG. 1. In embodiments, the metal layer can be, for example, any conductive material such as a copper wiring, aluminum, etc.

Still referring to FIG. 4, a hard layer 20 is blanket deposited on the wiring layer 15 and exposed portions of the layer 10. In embodiments, the hard layer 20 can be, for example, a nitride film, oxide film or other passivation layer, which is patterned to form an opening 20a. In embodiments, the hard layer 20 can also be a combination of materials such as a nitride layer and an oxide layer, amongst other materials, and can be deposited using any conventional deposition process, e.g., CVD. A pad structure 25 is deposited within the opening 20a and on portions of the hard layer 20. In embodiments, the pad structure 25 can be a conventional aluminum pad structure used for solder bump connections, which may be formed by processes described above, e.g., PECVD and lithographic patterning processes.

FIG. 4 further shows the formation of a buffer material 35' deposited on the exposed pad structure 25, on the tensile side of the structure. In embodiments, the buffer pad material 35' can be the same material as the passivation material 30, e.g., insulator material, and can be deposited, e.g., spin on, to a thickness of about 4 μm to 8 μm, 5 μm to 10 μm and more preferably 9 μm to 12 μm. In alternative embodiments, other thicknesses are contemplated by the present invention such as, example, a total thickness of upwards of anywhere within the range of about 10 μm to 30 μm.

In embodiments, the formation of the passivation material 35' directly on the pad structure 25 and hard layer 20 will not warp the wafer, due to the subsequent patterning processes. For example, in embodiments, the buffer pad material 35' undergoes a patterning process using conventional lithography processes to form a localized structure which alleviates any stresses imposed on the wafer which would otherwise cause warpage. More specifically, a photoresist is formed on the buffer pad material 35', and openings are formed therein to expose portions of the buffer pad material 35', while protecting (e.g., acting as a mask) the passivation material 35' on a tensile side of the structure, e.g., directly beneath a ball limiting metallurgy (BLM) edge, i.e., the point of maximum tensile stress during chip attach processes. The buffer pad material 35' will undergo a RIE process, removing exposed portions of the buffer pad material 35' while leaving the protected buffer pad material 35' on the tensile side of the structure.

Figure 5:
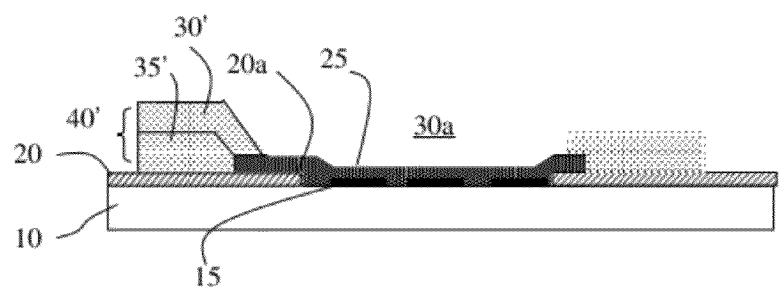

In FIG. 5, a passivation layer 30' (e.g., continuous film) is formed on the pad structure 25, hard layer 20 and buffer pad material 35', and then patterned to form an opening 30a shown in FIG. 5. In embodiments, the passivation layer 30' is a photosensitive polyimide (PSPI) formed on the underlying layers by, for example, a spin on process known to those of skill in the art. In embodiments, the present invention also contemplates the use of other materials for the passivation layer 30' such as, for example, $SiO_2$, $Si_3N_4$, other polyimides (PBO) or "C" based materials such as BCB. The passivation layer 30' can be deposited to a thickness of about 4 μm or 5 μm, which will effectively increase the thickness of the buffer pad material 35' for form a discrete, localized buffer pad island 40', thereby reducing stress issues on the BEOL structure.

The passivation layer 30' undergoes a conventional lithographic process to form opening 30a (final via), which exposes the underlying pad structure 25 and which is aligned with the wiring layer 15. In embodiments, the patterning process will also form the buffer pad island 40', i.e., the buffer pad material 35' and passivation layer 30', beneath a solder bump, itself. Much like in FIG. 3, the buffer pad island 40' will provide stress buffering properties, with secondary benefits due to the slight extension of the bump edge from the base of the final via structure.

Figure 6:
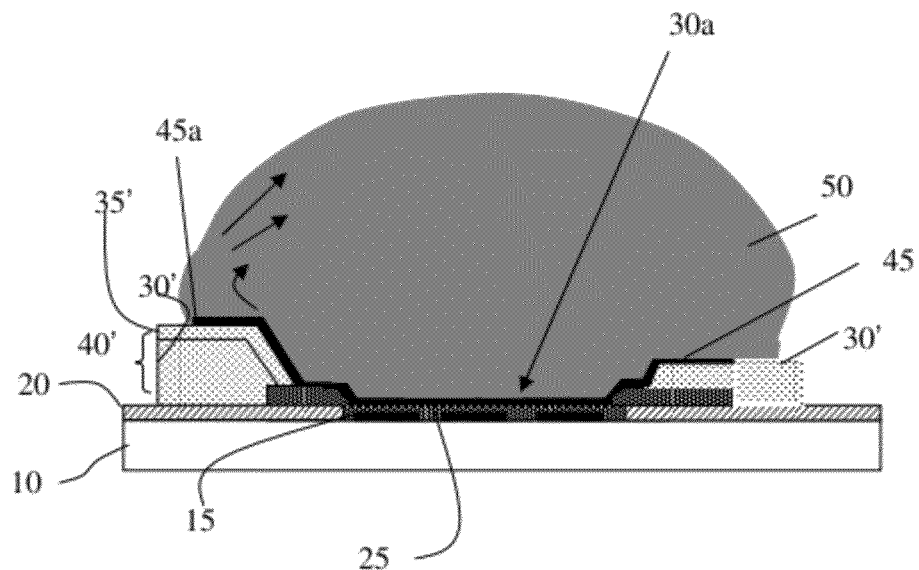

FIG. 6 shows additional processing steps and a respective structure in accordance with aspects of the present invention. More specifically, a BLM layer 45 is deposited on the pad structure 25, as well as the passivation layer 30' and buffer pad material 35'. In embodiments, the BLM layer 45 is patterned so that an edge 45a of the BLM layer 45 is approximately centered over the buffer pad material 35', e.g., buffer pad island 40'. In embodiments, the BLM layer 45 can be, for example, several layers such as, for example, a first layer of conductive material (e.g., Ti or TiW), with a copper layer and capping layer such as, for example, Palladium, in electrical communication with the underlying metal wiring 15 (through the pad structure 25). In further examples, other refractory metals are also contemplated by the present invention for use as the BLM 45. A solder bump 50, e.g., preferably a lead free solder bump, is formed on the BLM layer 45, preferably with its edge aligned with the edge 45a of the BLM layer 45.

As thus shown in FIG. 6, the tensile side of the solder bump (as shown by the arrows) is at a higher level than the compressive side (opposing side) of the solder bump. In this way, the buffer pad island 40', and more specifically, the buffer pad material 35', provides stress buffering properties of soft organic polyimide-like materials. In embodiments, a secondary benefit is due to the slight extension of the bump edge from the base of the final via structure. This secondary benefit derives from the length extension or from interruption of the stress field by the more complex double-via edge created with the bump pad. In this way, it is possible to obtain a shifted via effect, e.g., provides separation of the via edge stress field from the BLM edge, while eliminating any manufacturability issues with a thicker passivation layer 30'. Accordingly, the buffer pad island 40' and more specifically the buffer pad material 35' provides a tensile-only buffer pad island, which avoids warpage issue of the wafer while also decreasing stresses imposed on the structure during reflow processes of the solder bump.

Figure 7:
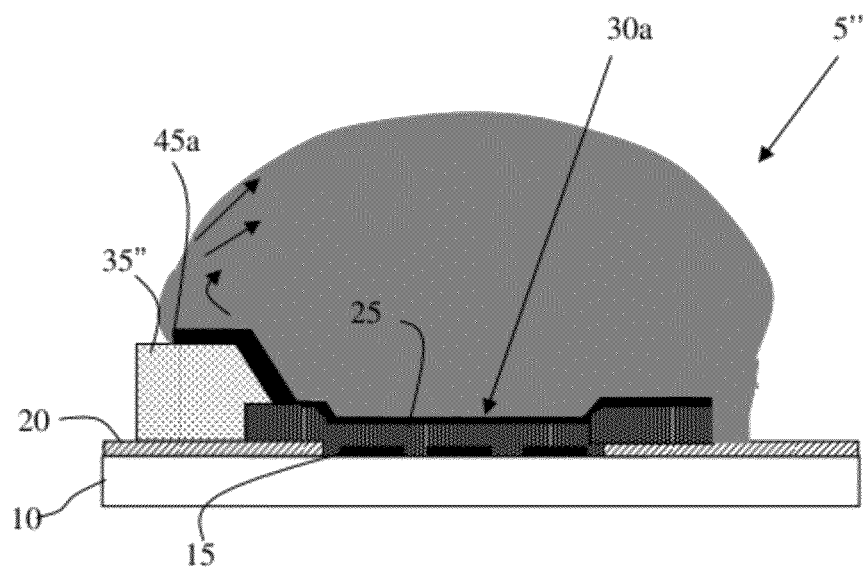
FIG. 7 shows fabrication processes and a respective structure in accordance with further aspects of the present invention.

FIG. 7 shows an alternative structure and respective processing steps in accordance with aspects of the present invention. More specifically, the structure 5" includes a patterned wiring layer 15 on layer 10, formed using conventional deposition and lithographic processes as described above. A hard layer 20 is blanket deposited on the wiring layer 15 and exposed portions of the layer 10, as described above. A pad structure 25 is deposited within an opening of the hard layer 20 and on portions of the hard layer 20. In embodiments, the pad structure 25 can be a conventional aluminum pad structure used for solder bump connections, which may be formed by processes described above, e.g., PECVD and lithographic patterning processes. A buffer pad material 35" is formed directly on the exposed pad structure 25, on only a tensile side of the structure 5". In this alternative structure, the blanket passivation layer is completely eliminated.

In embodiments, the buffer pad material 35" can be deposited, e.g., spin on, to a thickness of about 8 μm, and more preferably up to about 30 μm. In embodiments, the formation of the buffer pad material 35", e.g., insulator layer, will not warp the wafer, due to the subsequent patterning processes, to form a discrete, localized buffer pad island. For example, in embodiments, the buffer pad material 35" undergoes a patterning process using conventional lithography processes as described above. The patterning process results in the thick buffer material 35" being formed on a tensile side of the structure, e.g., directly beneath a ball limiting metallurgy (BLM) edge, i.e., the point of maximum tensile stress during chip attach processes.

In embodiments, the buffer pad material 35" is a photosensitive polyimide (PSPI) formed on the underlying layers by, for example, a spin on process known to those of skill in the art. In embodiments, the present invention also contemplates the use of other materials for the buffer pad material 35" such as, for example, $SiO_2$, $Si_3N_4$, other polyimides (PBO) or "C" based materials such as BCB. Much like in FIGS. 3 and 6, the buffer pad material 35" will shift the final via away from the tensile side of the structure, thereby acting as a stress buffering film directly beneath a ball limiting metallurgy (BLM) edge, i.e., the point of maximum tensile stress during chip attach processes.

Still referring to FIG. 7, a BLM layer 45 is deposited on the pad structure 25 (through final via 30a), as well as the buffer pad material 35". In embodiments, the BLM layer 45 is patterned so that an edge 45a of the BLM layer 45 is approximately centered on the buffer pad material 35". In embodiments, the BLM layer 45 can be, for example, several layers such as, for example, a first layer of conductive material (e.g., Ti or TiW), with a copper layer and capping layer such as, for example, Palladium. In embodiments, other refractory metals are also contemplated by the present invention for use with the BLM 45. A solder bump 50, e.g., preferably a lead free solder bump, is formed on the BLM layer 45, preferably with its edge aligned with the edge 45a of the BLM layer 45.

As thus shown in FIG. 7, the tensile side of the solder bump (as shown by the arrows) is at a higher level than the compressive side (opposing side) of the solder bump. In this way, the buffer pad material 35" provides stress buffering properties, with secondary benefits due to the slight extension of the bump edge from the base of the final via structure. Accordingly, the buffer pad material 35" (e.g., buffer pad island) provides a tensile-only buffer pad island, which avoids warpage issue of the wafer while also decreasing stresses imposed on the structure during reflow processes of the solder bump.

Figure 8:
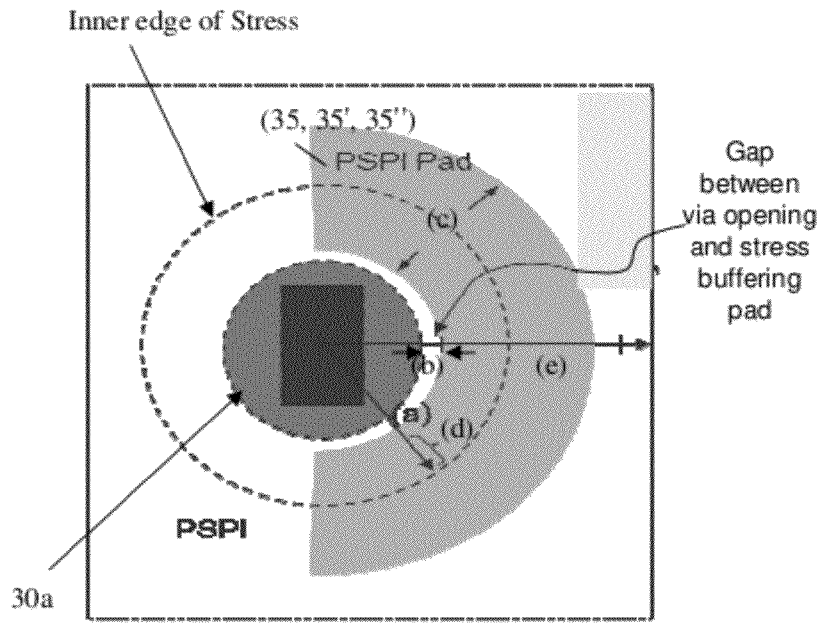
FIG. 8 shows a top down view of the structures shown in FIG. 3, 6 or 7, in accordance with an aspect of the present invention.

FIG. 8 shows a top down view of the structures in accordance with an aspect of the present invention. More specifically, the structure shown in FIG. 8 may be representative of the structures shown in, for example, FIG. 3, 6 or 7. As shown in FIG. 8, the stresses imposed by solder bump formation begin at distance (a) from a center point of the final via 30a. In embodiments, the distance (a) can be, for example, 56 μm from a center point of a final via 30a (elliptical shape via) having an opening of, for example, 45 μm; although other dimensions are also contemplated by the present invention, depending on the particular design criteria, technology node, etc. For example, a distance (a) can be about 46 μm for a final via opening having a dimension of 47 μm. Accordingly, it should be understood by those of ordinary skill in the art that the above dimensions are merely provided for non-limiting illustrative purposes.

FIG. 8 also shows that the buffer pad layer 35, 35', 35" (e.g., discrete, localized buffer pad island) is a half annular shape, positioned away from an edge of the final via 30a by distance (b). In embodiments, the buffer pad layer 35, 35', 35" provides about a 180 degree coverage. In non-limiting illustrative embodiments, the gap (b) may be about 5 μm or greater, e.g., about 7 μm to 10 μm; although other dimensions are also contemplated by the present invention, depending on other dimensions of the structure. In embodiments, the formation of the buffer pad materials 35, 35', 35" is well controlled, so the gap (b) can easily be other dimensions.

In embodiments, the discrete, localized buffer pad island can be centered about the stress line, e.g., an initiation point of stresses imposed on the structure, and may have a width (c) of, for example, about 40 μm to 55 μm. The width (c) of the buffer pad island may result in a pad overlap about the stress line of about 16 μm to 26 μm; although other dimensions are also contemplated by the present invention, depending on other dimensions of the structure. In further embodiments, the distance between center points of adjacent final vias may be, for example, distance (e). Distance (e) may be, for example, 75 μm or greater, depending on the technology node and other design considerations.

Figure 9:
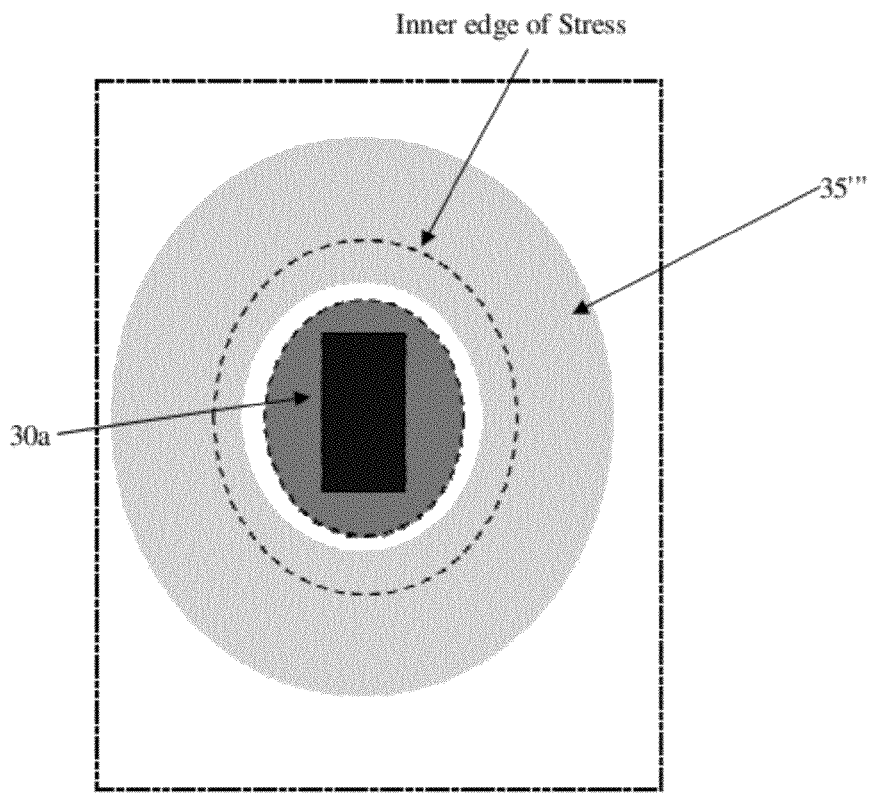
FIG. 9 shows a top down view of an alternative structure in accordance with another aspect of the present invention.

FIG. 9 shows a top down view of a structure in accordance with another aspect of the present invention. The embodiment of FIG. 9 shows a buffer pad island 35''', which is designed as a full annular buffer pad completely surrounding the final via 30a. This implementation provides improved stress reduction for packages that are already joined, but undergo additional heating processes. For example, additional heating of the package is known to soften the solder bump, which results in a phenomena of the compressive and tensile sides of the structuring reversing themselves. Accordingly, in such structure, it is desirable to have protection on both sides of the structure, so that when stresses are induced due to the reheating of the solder, such stresses can be reduced, minimized and/or eliminated by the buffer pad 35'''.

The buffer pad 35''' can be formed by depositing a separate passivation layer, e.g., insulator, on an already formed conventional passivation layer (or vice versa). In embodiments, the buffer pad 35''' can have a thickness of about 5 μm to 10 μm; although other dimensions are also contemplated by the present invention.

Figure 10:
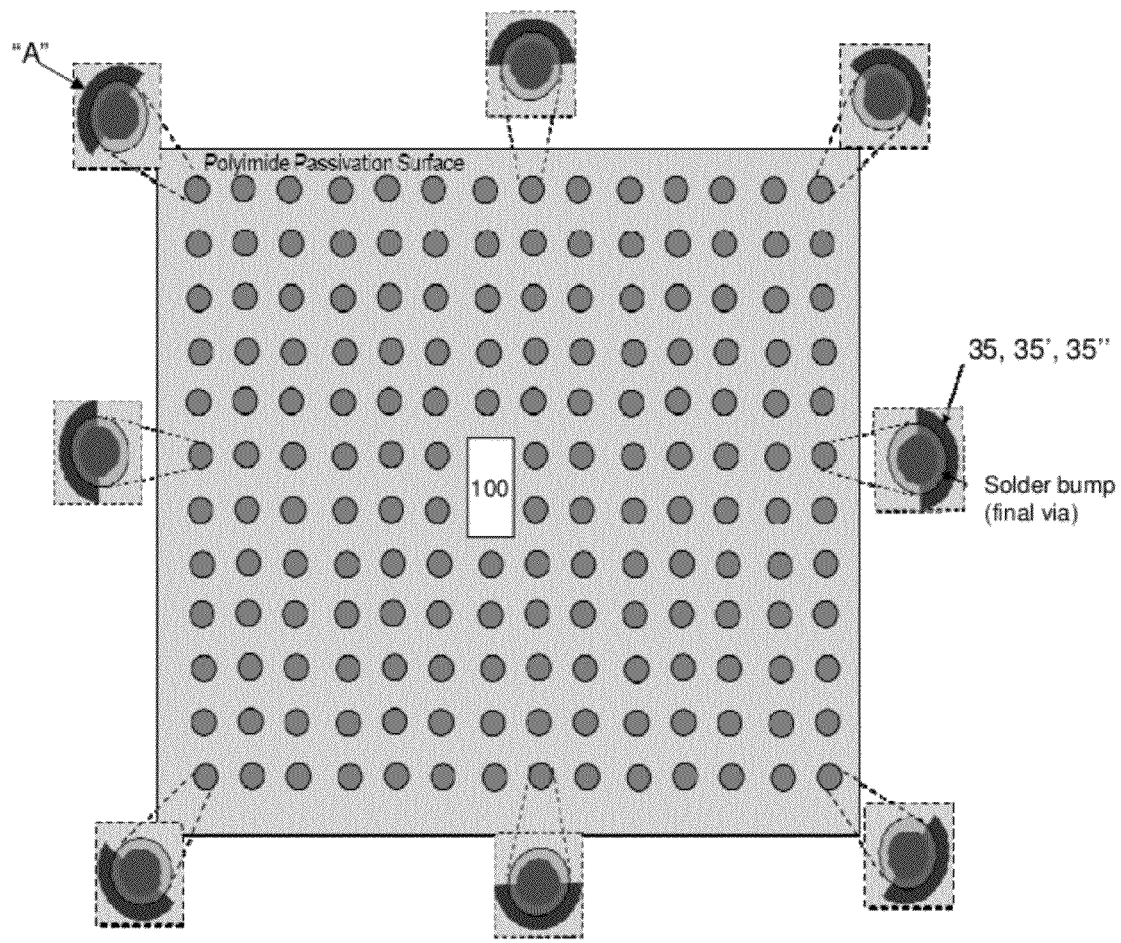
FIG. 10 shows a plurality of vias and respective orientations of a buffer pad, in accordance with aspects of the present invention.

FIG. 10 shows a top down view of the structure in accordance with another aspect of the present invention. More specifically, FIG. 10 shows different orientations of the discrete, localized buffer pad islands (e.g., buffer pads 35, 35', 35") in accordance with aspects of the present invention. As shown in FIG. 10, the discrete, localized buffer pad islands are preferably positioned away from a center of the structure. For example, as shown in FIG. 10, the apex "A" of the discrete, localized buffer pad island can be pointed towards different directions, (e.g., facing away from the geometric chip center 100) depending on the location of the final via (solder bump) and the geometric chip center 100. That is, the discrete, localized buffer pad island can be placed uniquely at each solder bump site so that it is as far from the chip center 100 as possible.

In this representation, the final vias are shown to be in eight different locations, all of which are extend around a geometric center 100 of the chip. In a more granular representation, the final vias can be provided in more locations. In embodiments, the location of the discrete, localized buffer pad island, i.e., on a tensile side of the chip, provide improved white bump mitigation compared to conventional solder bump configurations. For example, in embodiments, the discrete, localized buffer pad island reduces current density, which, in turn, decreases the likelihood of void formation. Also, the configuration of the discrete, localized buffer pad island reduces overall stress placed on the chip, thus minimizing delamination of an underlying dielectric layer.

Figure 11:
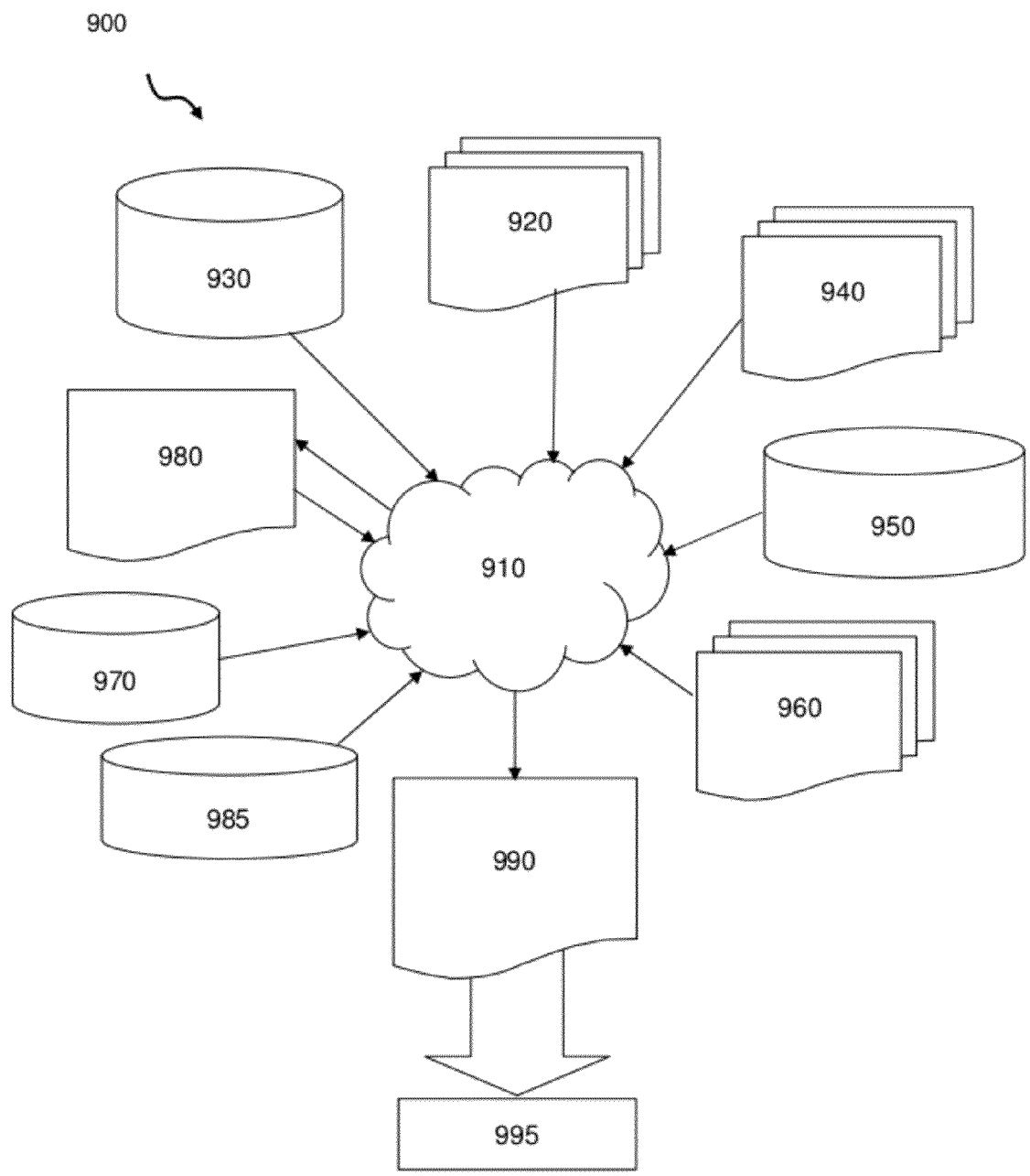
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for manufacturing a semiconductor chip comprising:
    forming a raised localized buffer pad structure on a tensile side of a metal layer that underlies a ball metallurgy layer of a solder bump connection,
    wherein:
        the raised localized buffer pad structure increases a height of a portion of a pad structure of the solder bump connection with respect to a compressive side of the metal layer;

the tensile side of the metal layer is at a radially outermost edge with respect to a geographic center of the chip; and the compressive side of the metal layer is at a radially innermost edge with respect to the geographic center of the chip the raised localized buffer pad structure is formed in an half annular shape in a surface plane of the chip, where an apex of the half annular shape is formed facing away from the geographic center point of chip.

2. The method of claim 1, further comprising:

forming the ball metallurgy layer on the pad structure, with an edge thereof raised and approximately aligned with a center of the localized buffer pad structure; and forming a solder bump on the ball metallurgy layer with an edge thereof substantially aligned with the edge of the ball metallurgy layer.

3. The method of claim 2, wherein the solder bump is a lead free solder bump formed on the ball metallurgy layer.

4. The method of claim 1, wherein the forming of the raised localized buffer pad structure comprises forming an insulator layer on an underlying continuous passivation layer, and patterning the insulator layer to remove portions thereof.

5. The method of claim 4, wherein the raised localized buffer pad structure and the underlying passivation layer has a total thickness of about 5 μm to 30 μm.

6. The method of claim 1, wherein the forming of the raised localized buffer pad structure comprises depositing and patterning an insulator layer on the pad structure, and forming a passivation layer over the raised localized buffer pad structure.

7. The method of claim 6, wherein the raised localized buffer pad structure and the passivation layer has a total thickness of about 5 μm to 30 μm.

8. The method of claim 1, wherein the forming of the raised localized buffer pad structure comprises depositing an insulator layer directly on the pad structure, on a side of a final via, and forming the ball metallurgy layer partially on the raised localized buffer pad structure, with an edge thereof substantially aligned with a center of the raised localized buffer pad structure.

9. The method of claim 8, wherein the raised localized buffer pad structure is a photosensitive polyimide material, deposited to a thickness of about 5 μm to 30 μm.

10. The method of claim 1, wherein the raised localized buffer pad structure is approximately centered over an initiation point of stresses imposed during solder bump formation.

11. The method of claim 1, wherein:

the metal layer is a patterned wiring layer;

the pad structure is a first passivation layer;

the raised localized buffer pad structure is a second passivation layer deposited on the first passivation layer; and the method further comprises:

patterning the raised localized buffer pad structure, the patterning forming a buffer pad island under an edge of the ball metallurgy layer at the tensile side of the metal layer;

forming the ball metallurgy layer on the pad structure, with an edge thereof raised and approximately aligned with a center of the localized buffer pad structure; and forming a solder bump on the ball metallurgy layer with an edge thereof substantially aligned with the edge of the ball metallurgy layer.

* * * * *